(12) United States Patent
Jhang et al.

(10) Patent No.: US 8,839,101 B2
(45) Date of Patent: Sep. 16, 2014

(54) FLEXIBLE METER CONFIGURATION SOFTWARE ARCHITECTURE

(75) Inventors: Hyoung Jhang, Johnscreek, GA (US); Parimal Arunkumar Desai, Smyrna, GA (US); David Frederick Sampson, Marietta, GA (US)

(73) Assignee: General Electric Company, Schenectady, NY (US)

( * ) Notice: Subject to any disclaimer, the term of this patent is extended or adjusted under 35 U.S.C. 154(b) by 399 days.

(21) Appl. No.: 12/986,397

(22) Filed: Jan. 7, 2011

(65) Prior Publication Data

US 2012/0179957 A1    Jul. 12, 2012

(51) Int. Cl.
| | | |
|---|---|---|
| *G06F 17/00* | (2006.01) | |
| *H04Q 9/00* | (2006.01) | |
| *G06F 9/445* | (2006.01) | |
| *G01R 22/00* | (2006.01) | |
| *G06F 19/00* | (2011.01) | |

(52) U.S. Cl.
CPC ............... *G06F 17/00* (2013.01); *H04Q 9/00* (2013.01); *G06F 9/44505* (2013.01); *G01R 22/00* (2013.01); *G06F 19/00* (2013.01)
USPC .......................................................... 715/255

(58) Field of Classification Search
USPC ............................. 715/200, 255, 227; 702/57
See application file for complete search history.

(56) References Cited

U.S. PATENT DOCUMENTS

| | | | | |
|---|---|---|---|---|
| 6,029,145 | A * | 2/2000 | Barritz et al. .................... | 705/34 |
| 6,199,068 | B1 * | 3/2001 | Carpenter .............................. | 1/1 |
| 6,208,147 | B1 * | 3/2001 | Yoon et al. ..................... | 324/430 |
| 6,339,750 | B1 * | 1/2002 | Hoyer et al. ................... | 702/182 |
| 6,538,577 | B1 * | 3/2003 | Ehrke et al. ............... | 340/870.02 |
| 6,629,044 | B1 * | 9/2003 | Papallo et al. .................... | 702/60 |
| 6,801,865 | B2 * | 10/2004 | Gilgenbach et al. ............ | 702/61 |
| 6,823,273 | B2 * | 11/2004 | Ouellette et al. ................ | 702/61 |
| 6,933,857 | B2 | 8/2005 | Foote | |
| 7,064,679 | B2 * | 6/2006 | Ehrke et al. ............... | 340/870.02 |
| 7,410,421 | B2 * | 8/2008 | Mathis ........................... | 463/37 |
| 7,447,603 | B2 * | 11/2008 | Bruno ............................. | 702/64 |
| 7,747,398 | B2 * | 6/2010 | McNutt ........................... | 702/57 |
| 8,543,251 | B2 * | 9/2013 | Plant .............................. | 700/298 |
| 8,706,436 | B2 * | 4/2014 | Rose et al. ....................... | 702/83 |
| 2005/0026691 | A1 * | 2/2005 | Mathis ........................... | 463/42 |
| 2005/0144437 | A1 * | 6/2005 | Ransom et al. ............... | 713/151 |
| 2007/0096942 | A1 * | 5/2007 | Kagan et al. ............. | 340/870.02 |
| 2008/0024320 | A1 * | 1/2008 | Ehrke et al. ............... | 340/870.02 |
| 2008/0086394 | A1 * | 4/2008 | O'Neil et al. ................... | 705/30 |
| 2008/0238406 | A1 * | 10/2008 | Banhegyesi .................. | 324/120 |
| 2009/0012917 | A1 * | 1/2009 | Thompson et al. ........... | 705/412 |

(Continued)

OTHER PUBLICATIONS

Steed et al., Geophysical Data Base Variable Resolution (GDBV): An Object-Oriented Database for Dynamic Geo-Acoustic Data Storage, IEEE 2001, pp. 132-140.*

*Primary Examiner* — Cong-Lac Huynh
(74) *Attorney, Agent, or Firm* — Hoffman Warnick LLC; William Heinze (57) ABSTRACT

Aspects of the invention provide a tool for configuring software for an electric meter. A parameters table having values for the electric meter in a platform independent format is created. The table is then merged with to a mapping table that is configured specifically to the particular model of the electric meter to be configured to form a build table that can be executed on the electric meter. The build table is then installed on the electric meter.

18 Claims, 3 Drawing Sheets

(56) References Cited

U.S. PATENT DOCUMENTS

| | | | |
|---|---|---|---|
| 2009/0079584 A1* | 3/2009 | Grady et al. | 340/870.02 |
| 2009/0138099 A1* | 5/2009 | Veillette | 700/22 |
| 2009/0252208 A1* | 10/2009 | Frye, Jr. | 375/222 |
| 2009/0292848 A1* | 11/2009 | Robinson et al. | 710/266 |
| 2010/0064001 A1* | 3/2010 | Daily | 709/203 |
| 2010/0073192 A1* | 3/2010 | Goldfisher et al. | 340/870.02 |
| 2010/0301771 A1* | 12/2010 | Chemel et al. | 315/294 |
| 2011/0118888 A1* | 5/2011 | White, II | 700/293 |
| 2011/0161951 A1* | 6/2011 | Anderson et al. | 717/172 |
| 2012/0005092 A1* | 1/2012 | Pitroda et al. | 705/39 |
| 2012/0011517 A1* | 1/2012 | Smith et al. | 718/104 |
| 2012/0078547 A1* | 3/2012 | Murdoch | 702/62 |
| 2012/0131217 A1* | 5/2012 | Delorme et al. | 709/230 |
| 2012/0131324 A1* | 5/2012 | Ansari et al. | 713/100 |
| 2012/0158199 A1* | 6/2012 | Plant | 700/292 |
| 2013/0036249 A1* | 2/2013 | Angaluri et al. | 711/6 |

* cited by examiner

FLEXIBLE METER CONFIGURATION SOFTWARE ARCHITECTURE

BACKGROUND ART

The disclosure relates generally to electric meter technology, and more particularly, to tools for configuring software for electric meters.

Since the early days of distributing electricity, meters have been used to track the amount of electricity used by a particular user. As demands for more functionality have increased, electric meters have progressed from mechanical devices that only monitored and displayed the amount of energy flowing through them to complex computerized systems having a variety of management and informational functions. Current electric meters may have internal computerized systems that include a combination of hardware and software required to operate them.

One challenge in electric meters has been in configuring the software when a new type of meter is introduced for use. Parameters must be configured to adapt information necessary to perform the functions required by the meter's user to the structure of the meter itself. Currently, this encompasses compiling these parameters into tables. The process must be repeated with each new model of electric meter, resulting in wasted time and resources.

BRIEF DESCRIPTION OF THE INVENTION

Aspects of the invention provide a tool for configuring software for an electric meter. A parameters table having values for the electric meter in a platform independent format is created. The table is then merged with a mapping table that is configured specifically to the particular model of the electric meter to be configured to form a build table that can be executed on the electric meter. The build table is then installed on the electric meter.

A first aspect of the invention provides a computer-implemented method of configuring software for an electric meter, the method comprising: creating a parameters table having values for the electric meter in a platform independent format; merging the parameters table with a mapping table configured specifically to a model of the electric meter to form a build table that is executable on the electric meter; and installing the build table on the electric meter.

A second aspect of the invention provides a computer system for configuring software for an electric meter, the computer system comprising: a component configured to create a parameters table having values for the electric meter in a platform independent format; a component configured to merge the parameters table with a mapping table configured specifically to a model of the electric meter to form a build table that is executable on the electric meter; and a component configured to install the build table on the electric meter.

A third aspect of the invention provides a computer program comprising program code embodied in at least one computer-readable medium, which when executed, enables a computer system to implement a method of configuring software for an electric meter, the method comprising: creating a parameters table having values for the electric meter in a platform independent format; merging the parameters table with a mapping table configured specifically to a model of the electric meter to form a build table that is executable on the electric meter; and installing the build table on the electric meter.

A fourth aspect of the invention provides a method of generating a computer system for evaluating generator operation, the method comprising: providing a computer system operable to: create a parameters table having values for the electric meter in a platform independent format; merge the parameters table with a mapping table configured specifically to a model of the electric meter to form a build table that is executable on the electric meter; and install the build table on the electric meter.

A fifth aspect of the invention provides a method comprising: at least one of providing or receiving a copy of a computer program that is encoded in a set of data signals, wherein the computer program enables a computer system to implement a method of evaluating generator operation, the method comprising: creating a parameters table having values for the electric meter in a platform independent format; merging the parameters table with a mapping table configured specifically to a model of the electric meter to form a build table that is executable on the electric meter; and installing the build table on the electric meter.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a tool for configuring software for an electric meter. A parameters table having values for the electric meter in a platform independent format is created. The table is then merged with a mapping table that is configured specifically to the particular model of the electric meter to be configured to form a build table that can be executed on the electric meter. The build table is then installed on the electric meter.

Figure 1:
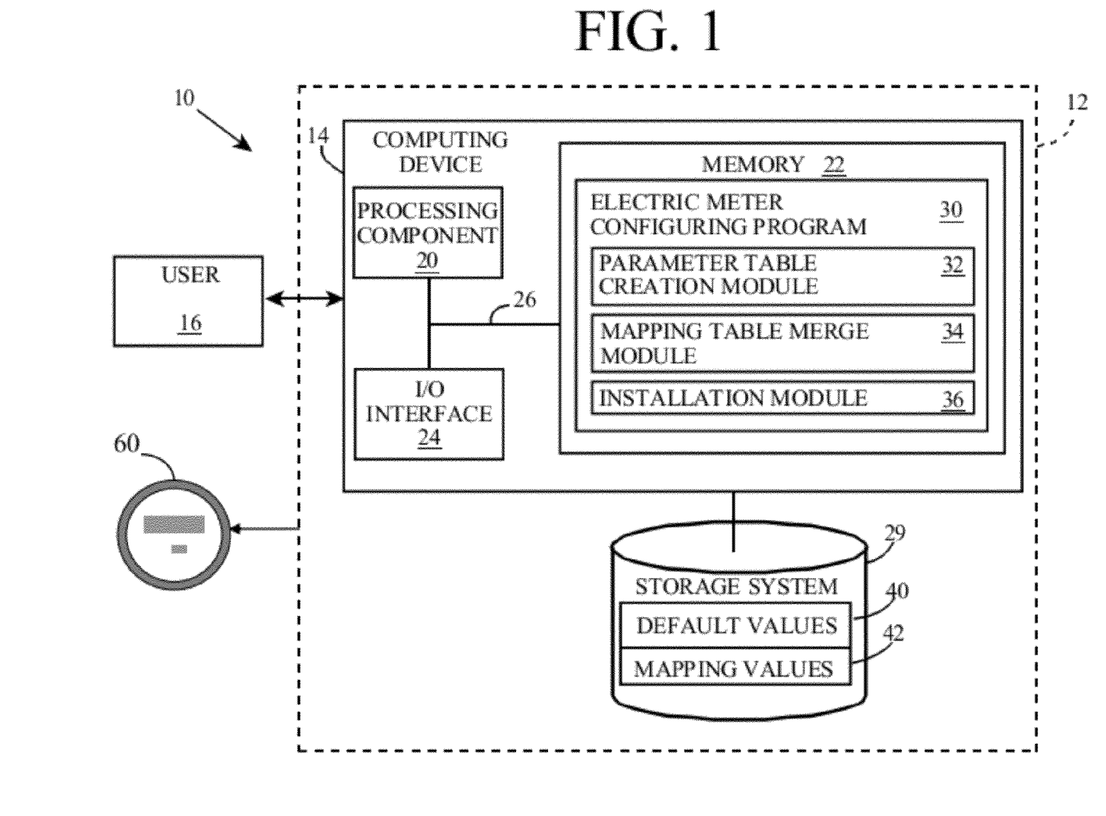
FIG. 1 shows an illustrative environment for monitoring and diagnosing the operation of a generator according to an embodiment.

Turning to the drawings, FIG. 1 shows an illustrative environment 10 for configuring software for an electric meter 60 according to an embodiment. To this extent, environment 10 includes a computer system 12 that can perform a process described herein in order to configure software for electric meter 60. In particular, computer system 12 is shown including a computing device 14 that includes an electric meter configuring program 30, which makes computing device 14 operable to configure software for electric meter 60 by performing a process described herein.

Computing device 14 is shown including a processing component 20 (e.g., one or more processors), a memory 22, a storage system 29 (e.g., a storage hierarchy), an input/output (I/O) interface component 24 (e.g., one or more I/O interfaces and/or devices), and a communications pathway 26. In general, processing component 20 executes program code, such as electric meter configuring program 30, which is at least partially fixed in memory 22. While executing program code, processing component 20 can process data, which can result in reading and/or writing transformed data from/to memory 22 and/or I/O component 24 for further processing. Pathway 26 provides a communications link between each of the components in computer system 12. I/O interface component 24 can comprise one or more human I/O devices, which enable a human user 16 to interact with computer system 12 and/or one or more communications devices to enable a system user 16 to communicate with computer system 12 using any type of communications link. To this extent, electric meter configuring program 30 can manage a set of interfaces (e.g., graphical user interface(s), application program interface, and/or the like) that enable human and/or system users 16 to interact with electric meter configuring program 30. Further, electric meter configuring program 30 can manage (e.g., store, retrieve, create, manipulate, organize, present, etc.) the data, such as default values 40 and/or mapping values 42, using any solution.

In any event, computer system 12 can comprise one or more general purpose computing articles of manufacture 14 (e.g., computing devices) capable of executing program code, such as electric meter configuring program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, electric meter configuring program 30 can be embodied as any combination of system software and/or application software. In any event, the technical effect of computer system 12 is to provide processing instructions to computing device 14 in order to configure software for electric meter 60.

Further, electric meter configuring program 30 can be implemented using a set of modules 32-36. In this case, a module 32-36 can enable computer system 12 to perform a set of tasks used by electric meter configuring program 30, and can be separately developed and/or implemented apart from other portions of electric meter configuring program 30. As used herein, the term "component" means any configuration of hardware, with or without software, which implements the functionality described in conjunction therewith using any solution, while the term "module" means program code that enables a computer system 12 to implement the actions described in conjunction therewith using any solution. When fixed in a memory 22 of a computer system 12 that includes a processing component 20, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 12.

When computer system 12 comprises multiple computing devices 14, each computing device can have only a portion of electric meter configuring program 30 fixed thereon (e.g., one or more modules 32-36). However, it is understood that computer system 12 and electric meter configuring program 30 are only representative of various possible equivalent computer systems that may perform a process described herein. To this extent, in other embodiments, the functionality provided by computer system 12 and electric meter configuring program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 12 includes multiple computing devices 14, the computing devices can communicate over any type of communications link. Further, while performing a process described herein, computer system 12 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, electric meter configuring program 30 enables computer system 12 to configure software for electric meter 60. To this extent, electric meter configuring program 30 is shown including a parameter table creation module 32, a mapping table merge module 34, and an installation module 36.

Figure 2:
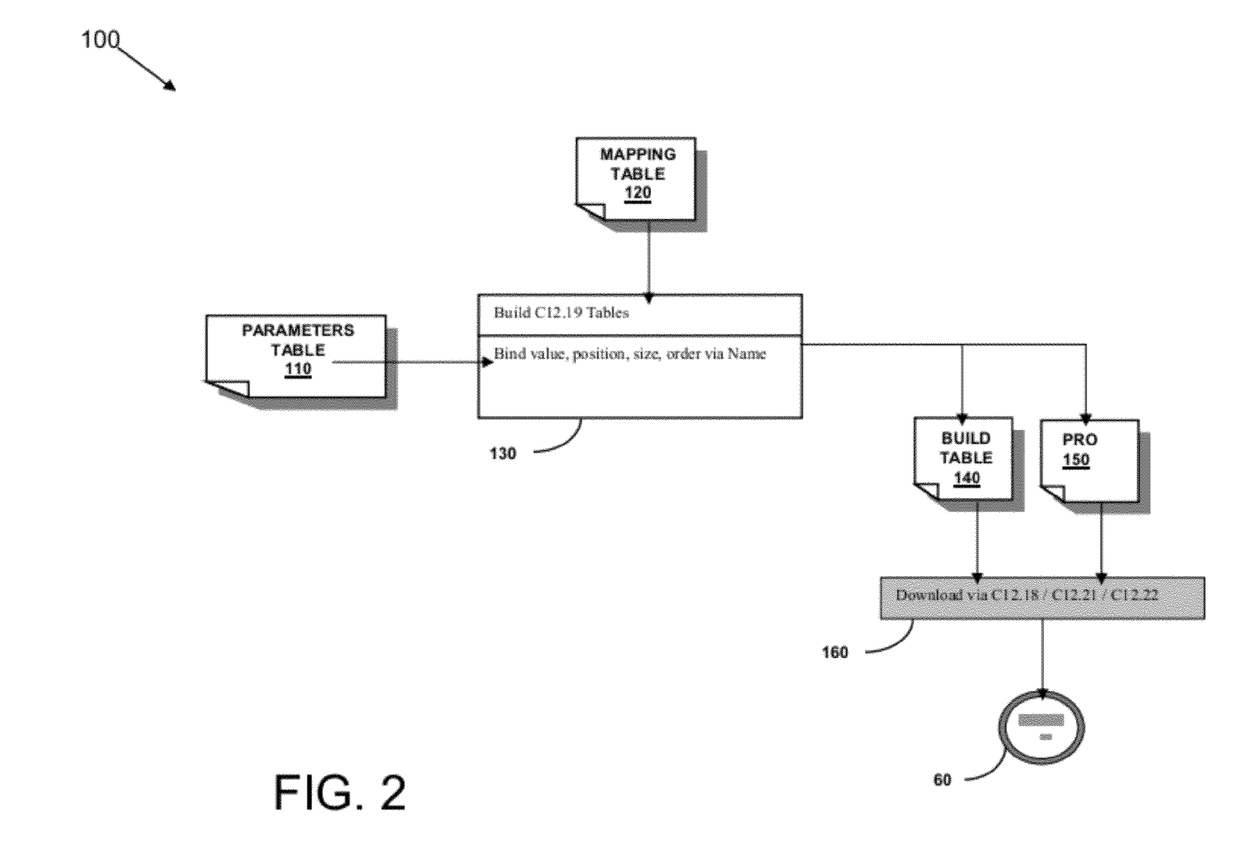
FIG. 2 shows a flow diagram in which electrical meter software is configured, according to an embodiment.

Referring now to FIGS. 1 and 2 concurrently, computer system 12 (e.g., parameter table creation module 32) creates a parameters table 110 for electric meter 60 that contains values for the electric meter 60 in a platform independent format. To this extent, parameters table 110 contains the information necessary to allow a specific electric meter 60 to perform its intended functions in its intended environment. The values are stored in a common format that can be used for electric meters 60 of variable model types.

Figure 3:
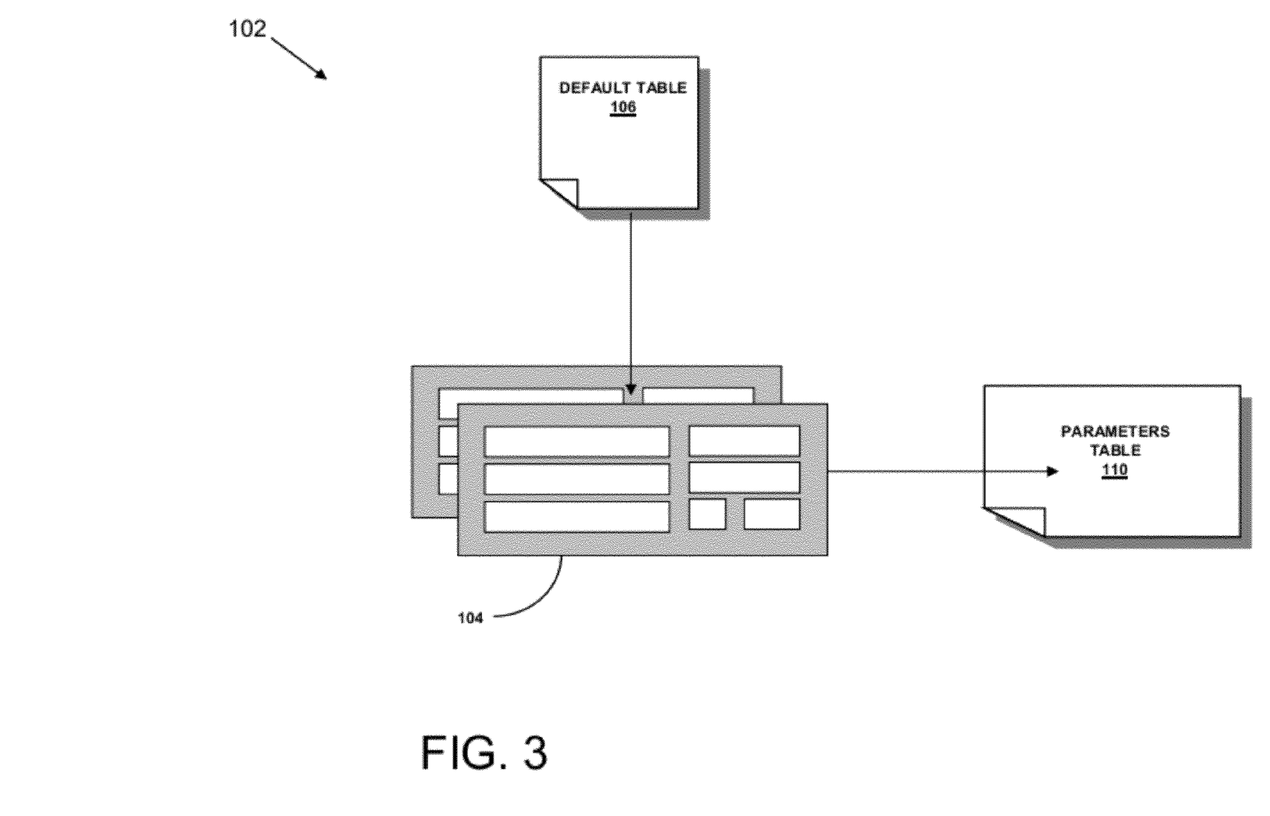
FIG. 3 shows a flow diagram in which a parameters table is created, according to an embodiment.

Turning now to FIG. 3, an embodiment 102 for creating parameters table 110 is shown. A graphical user interface (GUI) 104 may provide user 16 a framework for entering and/or editing values for parameters table 110, such as by user 16 (FIG. 1). These values may then be merged with a defaults table 106 to validate the values entered by user 16 and to use the values to form parameters table 110. To this extent, default table 106 can provide a framework for the values entered by user 16 via the GUI 104. This framework can define attributes for the values entered via GUI 104, such as a name of the property, a data type of the property, a range of acceptable values for the property, a list of acceptable values for the properties, and/or a default value for the property. In addition, default table 106 may include default values 40 (FIG. 1) that are applicable to a plurality of electric meters 60 to be configured. These default values 40 may include such properties such as the operator of electric meter 60, rules for operation of electric meter 60, and/or business rules that govern the financial arrangements pertaining to the electric meter 60. An example defaults table 106 could be as follows:

```
<MeterDefault MeterType= "kvc" TimeStamp= "03/08/2010"
Author= "Hyoung Jhang">
    <Table Id= "5" TableType= "Standard">
        <field name= "Meter ID 1" type= "string" default=
        "000000000"/>
        <field name= "Meter ID 2" type= "string" default=
        "000000000"/>
    </Table>
    <Table Id= "6" TableType= "Standard">
        <field name= "Owner name" type= "string"/>
```

```
        <field name= "Utility Division" type= "string"/>
        <field name= "Service Point" type= "string"/>
        <field name= "Electrical Address" type= "string"/>
        <field name= "Device ID" type= "string"/>
        <field name= "Utility Serial No" type= "string"/>
        <field name= "Customer ID" type= "string"/>
        <field name= "X Coordinate" type= "string"/>
        <field name= "Y Coordinate" type= "string"/>
        <field name= "Z Coordinate" type= "string"/>
        <field name= "Tariff ID" type= "string"/>
        <field name= "SW Vendor1" type= "string" default=
"GE ENERGY"/>
        <field name= "SW Version (Vendor1)" type= "string"
default= "GE ENERGY"/>
        <field name= "SW Vendor2" type= "string" default=
"GE ENERGY"/>
        <field name= "SW Version (Vendor2)" type= "string"
default= "GE ENERGY"/>
        <field name= "Programmer Name" type= "string"
default= "GE ENERGY"/>
        <field name= "Misc ID" type= "string"/>
    </Table>
    <Table Id= "52" TableType= "Standard">
        <field name= "Current Date" type= "string" default=
"03/09/2010"/>
        <field name= "Current Day of Week" type= "string" default=
"Tuesday"/>
        <field name= "Current Time" type= "string" default=
"07:00:00"/>
    </Table>
    <Table Id= "67" TableType= "Manufacture">
        <field name= "Transformer Ratio – Current" type= "int16"
default= "5" range= "1,1000"/>
        <field name= "Transformer Ratio – Voltage" type= " int16"
default= "120 range= "100,2000"/>
        <field name= "User Defined Field #1" type= "string"/>
        <field name= "User Defined Field #2" type= "string"/>
        <field name= "User Defined Field #3" type= "string"/>
        <field name= "Mark LP Interval as an Outage Interval"
type= " int16" default= "15" range= "1,840"/>
        <field name= "Time Until Automatic Reset" type= "int32"
default= "31" range= "1,1000"/>
    </Table>
</MeterDefault>
```

As stated above, the combining of defaults table 106 and user 16 inputs into GUI 104 yields parameters table 110. An example parameters table 110 could be as follows:

```
<MeterEdit MeterType= "kvc" TimeStamp = "03/08/2010"
Author= "Hyoung Jhang">
    <Table Id= "5" TableType= "Standard">
        <field name= "Meter ID 1" value= "100000000"/>
        <field name= "Meter ID 2" value= "000000001"/>
    </Table>
    <Table Id= "6" TableType= "Standard">
```

```
<MeterMap MeterType= "kvc" TimeStamp= "03/08/2010" Author= "Hyoung
Jhang">
    <Table Id= "5" TableType= "Standard">
        <field name= "Meter ID 1" type= "string" size= "9" offset= "2"/>
        <field name= "Meter ID 2" type= "string" size= "9" offset= "11"/>
    </Table>
    <Table Id= "6" TableType= "Standard">
        <field name= "Owner name" type= "string" size= "20" offset= "0"/>
        <field name= "Utility Division" type= "string" size= "20" offset= "20"/>
        <field name= "Service Point" type= "string" size= "20" offset= "40"/>
        <field name= "Electrical Address" type= "string" size= "20"
offset= "60"/>
        <field name= "Device ID" type= "string" size= "20" offset= "80"/>
        <field name= "Utility Serial No" type= "string" size= "20"
offset= "100"/>
        <field name= "Customer ID" type= "string" size= "20" offset= "120"/>
        <field name= "X Coordinate" type= "string" size= "10" offset= "140"/>
```

```
        <field name= "Owner name" value = "AEP"/>
        <field name= "Utility Division" value= "GEORGIA"/>
        <field name= "Service Point" value= "ATLANTA"/>
        <field name= "Electrical Address" value= "1300
Parkwood Circle"/>
        <field name= "Device ID" value= "00000001"/>
        <field name= "Utility Serial No" value= "000320"/>
        <field name= "Customer ID" value= "179501"/>
        <field name= "X Coordinate" value= "121.70"/>
        <field name= "Y Coordinate" value = "270.29"/>
        <field name= "Z Coordinate" value = "12.0"/>
        <field name= "Tariff ID" value = "AZ1"/>
        <field name= "SW Vendor1" value = "GE ENERGY"/>
        <field name= "SW Version (Vendor1)" value = "GE
ENERGY"/>
        <field name= "SW Vendor2" value = "GE ENERGY"/>
        <field name= "SW Version (Vendor2)" value = "GE
ENERGY"/>
        <field name= "Programmer Name" value = "GE ENERGY"/>
        <field name= "Misc ID" value = "string"/>
    </Table>
    <Table Id= "52" TableType= "Standard">
        <field name= "Current Date value = "03/09/2010"/>
        <field name= "Current Day of Week" value = "Tuesday"/>
        <field name= "Current Time" value = "07:00:00"/>
    </Table>
    <Table Id= "67" TableType= "Manufacture">
        <field name= "Transformer Ratio – Current" value= "5"/>
        <field name= "Transformer Ratio – Voltage" value = "120"/>
        <field name= "User Defined Field #1"/>
        <field name= "User Defined Field #2"/>
        <field name= "User Defined Field #3"/>
        <field name= "Mark LP Interval as an Outage Interval"
value = "15"/>
        <field name= "Time Until Automatic Reset" value = "31"/>
    </Table>
</MeterEdit>
```

Referring back to FIGS. 1 and 2 combined, after parameters table 110 has been created, computer system 12 (e.g., mapping table merge module 34) can merge parameters table 110 with a mapping table 120 configured specifically to a model of electric meter 60 to form a build table 140. Mapping table 120 provides a template for a particular model of electric meter 60 that can be used in a late property binding process. To this extent, an identical version of mapping table 120 can be used by mapping table merge module 34 to configure any electric meter 60 of a particular model. In operation, the merging of mapping table 120 and parameters table 110 takes the values from parameters table 110, which are desired for the specific electric meter 60 to be deployed, and arranges them in the order and with the format necessary for the specific model of electric meter 60 to function. Values of properties in mapping table 120 are set using values of the properties in properties table 110. An example of parameters table 110 could be as follows:

-continued

```
    <field name="Y Coordinate" type="string" size="10" offset="150"/>
    <field name="Z Coordinate" type="string" size="10" offset="160"/>
    <field name="Tariff ID" type = "string" size="8" offset="170"/>
    <field name="SW Vendor1" type="string" size="4" offset="178"/>
    <field name="SW Version (Vendor1)" type="string" size="2"
offset="182"/>
    <field name="SW Vendor2" type="string" size="4" offset="184"/>
    <field name="SW Version (Vendor2)" type="string" size="2"
offset="188"/>
    <field name="Programmer Name" type="string" size="10"
offset="190"/>
    <field name="Misc ID" type="string" size="30" offset="200"/>
  </Table>
  <Table Id="52" TableType="Standard">
    <field name="Current Date" type="string" size="3" offset="0"/>
    <field name="Current Day of Week" type="string" size="1"
offset="8"/>
    <field name="Current Time" type="string" size="4" offset="3"/>
  </Table>
  <Table Id="67" TableType="Manufacture">
    <field name="Transformer Ratio – Current" type="int16" size="2"
offset="150"/>
    <field name="Transformer Ratio – Voltage" type="int16" size="2"
offset="152"/>
    <field name = "User Defined Field #1" type = "string" size="6"
offset="156"/>
    <field name = "User Defined Field #2" type = "string" size="6"
offset="162"/>
    <field name = "User Defined Field #3" type = "string" size="6"
offset="168"/>
    <field name= "Mark LP Interval as an Outage Interval" type=" int16"
size="2" offset="176"/>
    <field name= "Time Until Automatic Reset" type="int32" size="4"
offset="178"/>
  </Table>
</MeterMap>
```

After the merge of parameters table 110 and mapping table 120, it is determined whether any properties remain unassigned and these properties are discarded. All other properties can be packed into an array of bytes and can be written in one table write command. The result of the merge of parameters table 110 and mapping table 120 by mapping table merge module 34 is a build table 140 and PRO files 150 that are executable on electric meter 60. Build table 140 can be a table in the ANSI C12.19 format, such as, for example, 2008 Version. PRO files 150 are distributed freely and downloaded into meters. Build table 140, however, can be utilized over Advanced Metering Infrastructure (AMI), as it allows finer control over any property of a meter table. Computer system 12 (e.g., installation module 36) can then install build table 140 on electric meter 60. An example of parameters table 110 could be as follows:

```
<Table Id="5" TableType="Standard" pack="true">
    <field name="Meter ID 1" type="string" size="9"
offset="2" value="100000000"/>
    <field name="Meter ID 2" type="string" size="9"
offset="11" value="000000001"/>
</Table>
<Table Id="67" TableType="Manufacture" pack="false">
    <field name="Transformer Ratio – Current" type=
"int16" size="2" offset="150" value="5"/>
    <field name="Transformer Ratio – Voltage" type="
int16" size="2" offset="152"
```

While shown and described herein as a method and system for configuring software for an electric meter, it is understood that aspects of the invention further provide various alternative embodiments. For example, in one embodiment, the invention provides a computer program fixed in at least one computer-readable medium, which when executed, enables a computer system to configuring software for an electric meter. To this extent, the computer-readable medium includes program code, such as electric meter configuring program 30 (FIG. 1), which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, such as electric meter configuring program 30 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for configuring software for an electric meter. In this case, a computer system, such as computer system 12 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "approximately" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to approximately 25 wt %, or, more specifically, approximately 5 wt % to approximately 20 wt %", is inclusive of the endpoints and all intermediate values of the ranges of "approximately 5 wt % to approximately 25 wt %," etc).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of configuring software for an electric meter, the method comprising:
    creating a configuration parameters table having values for the electric meter in a platform independent format, the platform independent format being a format that is not specifically adapted to a model of the electric meter;
    merging the configuration parameters table with a configuration mapping table configured specifically to the model of the electric meter to transform the parameters table into a configuration build table and PRO files that are executable on the electric meter to operate the electric meter; and
    installing the configuration build table and the PRO files on the electric meter.

2. The method of claim 1, wherein the configuration parameters table is an Extensible Markup Language (XML) table.

3. The method of claim 1, wherein the creating further comprises:
    obtaining values for properties specific to the electric meter via a graphical user interface (GUI);
    validating the values with a defaults table including default values for the electric meter.

4. The method of claim 3, wherein the defaults table defines at least one of a property name, a property type, acceptable property values, or a property default value.

5. The method of claim 3, wherein the defaults table includes business rules.

6. The method of claim 1, wherein the configuration build table includes an ANSI C12.19 table.

7. A computer system for configuring software for an electric meter, the computer system comprising:
    a component configured to create a configuration parameters table having values for the electric meter in a platform independent format, the platform independent format being a format that is not specifically adapted to a model of the electric meter;
    a component configured to merge the configuration parameters table with a configuration mapping table configured specifically to the model of the electric meter to form a configuration build table and PRO files that are executable on the electric meter to operate the electric meter; and
    a component configured to install the configuration build table and the PRO files on the electric meter.

8. The system of claim 7, wherein the configuration parameters table is an Extensible Markup Language (XML) table.

9. The system of claim 7, further comprising:
    a component configured to obtain values for properties specific to the electric meter via a graphical user interface (GUI); and
    a component configured to validate the values with a defaults table including default values for the electric meter.

10. The system of claim 9, wherein the defaults table defines at least one of a property name, a property type, acceptable property values, or a property default value.

11. The system of claim 9, wherein the defaults table includes business rules.

12. The system of claim 7, wherein the configuration build table includes an ANSI C12.19 table.

13. A computer-readable device having a computer program comprising program code embodied therein, which when executed, enables a computer system to implement a method of configuring software for an electric meter, the method comprising:
    creating a configuration parameters table having values for the electric meter in a platform independent format, the platform independent format being a format that is not specifically adapted to a model of the electric meter;
    merging the configuration parameters table with a configuration mapping table configured specifically to the model of the electric meter to form a configuration build table and PRO files that are executable on the electric meter to operate the electric meter; and
    installing the configuration build table and the PRO files on the electric meter.

14. The computer-readable device of claim 13, wherein the configuration parameters table is an Extensible Markup Language (XML) table.

15. The computer-readable device of claim 13, the creating further comprising:
    obtaining values for properties specific to the electric meter via a graphical user interface (GUI); and
    validating the values with a defaults table including default values for the electric meter.

16. The computer-readable device of claim 15, wherein the defaults table defines at least one of a property name, a property type, acceptable property values, or a property default value.

17. The computer-readable device of claim 15, wherein the defaults table includes business rules.

18. The computer-readable device of claim 13, wherein the configuration build table is an ANSI C 12.19 table.

\* \* \* \* \*